United States Patent
Ichikawa

(10) Patent No.: US 7,495,330 B2
(45) Date of Patent: Feb. 24, 2009

(54) SUBSTRATE CONNECTOR FOR INTEGRATED CIRCUIT DEVICES

(75) Inventor: Kinya Ichikawa, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 382 days.

(21) Appl. No.: 11/173,657

(22) Filed: Jun. 30, 2005

(65) Prior Publication Data

US 2007/0001277 A1   Jan. 4, 2007

(51) Int. Cl.
*H01L 23/04* (2006.01)
(52) U.S. Cl. .................................. 257/698; 257/778
(58) Field of Classification Search ................. 257/778, 257/686, 685, 698, 777
See application file for complete search history.

(56) References Cited

U.S. PATENT DOCUMENTS

| | | | |
|---|---|---|---|
| 5,321,583 A | 6/1994 | McMahon | |
| 6,095,823 A | 8/2000 | Banks | |
| 6,245,594 B1 | 6/2001 | Wu et al. | |
| 6,255,740 B1 | 7/2001 | Tsuji et al. | |
| 6,294,407 B1 * | 9/2001 | Jacobs | 438/118 |
| 6,319,829 B1 | 11/2001 | Pasco et al. | |
| 6,372,620 B1 | 4/2002 | Oosawa et al. | |
| 6,451,627 B1 | 9/2002 | Coffman | |
| 6,469,908 B2 | 10/2002 | Patel et al. | |
| 6,528,874 B1 | 3/2003 | Iijima et al. | |
| 6,548,328 B1 | 4/2003 | Sakamoto et al. | |
| 6,586,684 B2 | 7/2003 | Frutschy et al. | |
| 6,589,870 B1 | 7/2003 | Katoh | |
| 6,617,236 B2 | 9/2003 | Oosawa et al. | |
| 6,646,337 B2 | 11/2003 | Iijima et al. | |
| 6,671,947 B2 | 1/2004 | Bohr | |
| 6,782,610 B1 | 8/2004 | Iijima et al. | |
| 6,814,584 B2 | 11/2004 | Zaderej | |
| 6,828,221 B2 | 12/2004 | Iijima et al. | |
| 6,854,985 B1 | 2/2005 | Weiss | |
| 6,884,709 B2 | 4/2005 | Iijima et al. | |
| 6,908,792 B2 | 6/2005 | Bruce et al. | |
| 6,977,441 B2 * | 12/2005 | Hashimoto | 257/777 |
| 7,034,401 B2 * | 4/2006 | Savastiouk et al. | 257/778 |
| 7,097,462 B2 | 8/2006 | Ichikawa | |
| 7,268,419 B2 * | 9/2007 | Cornelius | 257/686 |
| 2003/0207492 A1 | 11/2003 | Maeda et al. | |
| 2006/0038303 A1 | 2/2006 | Sterrett et al. | |
| 2006/0077644 A1 | 4/2006 | Nickerson et al. | |

OTHER PUBLICATIONS

Chipsupply.com, "Chip Scale Packaging (CSP)", [online], [retrieved on Apr. 22, 2004], retrieved from the Internet at <URL: http://www.chipsupply.com/corporate/interconnect%20solutions/chip%20scale.htm>.

(Continued)

*Primary Examiner*—S. V Clark
(74) *Attorney, Agent, or Firm*—Konrad Raynes & Victor LLP

(57) ABSTRACT

In one embodiment, a stack is assembled comprising a first integrated circuit package, and a substrate connector which connects the integrated circuit package to a circuit board. In one embodiment, the substrate connector includes an interposer substrate and a patch substrate bonded to the interposer substrate. Each substrate includes columnar conductors extending through the substrate to connect to another layer. Other embodiments are described and claimed.

22 Claims, 9 Drawing Sheets

OTHER PUBLICATIONS

Dataweek, "Stacked-CSP Delivers Flexibility, Reliability and Space-Saving Capabilities", [online], Aug. 27, 2004, [Retrieved on Jul. 14, 2004], retrieved from the Internet at <URL: http://dataweek.co.za/news.asp?pklNewsID=11744&pklIssueID=348&pklCategoryID=36>.

IMEC, "Advanced Packaging Technologies to Bridge the Interconnect Technology Gap", downloaded prior to Aug. 23, 2004, pp. 1-8.

Intel Corporation, "Silicon: Packaging Solutions for a Mobile Marketplace", [online], 2004, [Retrieved on Jul. 14, 2004], retrieved from the Internet at <http://www.intel.com/research/silicon/mobilepackaging.htm>.

Intel Corporation, "The Chip Scale Package (CSP)", 2000 Packaging Databook, 2000, Ch. 15, pp. 15-1 through 15-16.

IVF—The Swedish Institute of Production Engineering Research, "Chapter B: Flip-Chip Technology", [online], [retrieved on Apr. 22, 2004], retrieved from the Internet at <URL: http://extra.ivf.se/ngl/B-Flip-Chip/ChapterB1.htm>.

Mahajan, R., K. Brown, and V. Atluri, "The Evolution of Microprocessor Packaging", Intel Technology Journal, Q3, 2000, pp.

Mahajan, R., R. Nair, V. Wakharkar, J. Swan, J. Tang, and G. Vandentop, "Emerging Directions for Packaging Technologies", Intel Technology Journal, vol. 6, Issue 2, May 2002, pp. 62-75.

Mallik, D., K. Radhakrishnan, J. He, C. Chiu, T. Kamgaing, D. Searls, & J.D. Jackson, "Advanced Package Technologies for High-Performance Systems," Intel Technology Journal, vol. 9, Issue 4, Nov. 9, 2005, 16 pp.

McCormick, A., "Pins & Vias: New Processes, Materials Extend Flexible Circuit Use", [online], May 2003, [Retrieved on Jul. 14, 2004], retrieved from the Internet at <http://neasia.nikkeibp.com/nea/200305/manu_244639.html>.

North Corporation, "Neo-Manhattan Technology: A Novel HDI Manufacturing Process", from IPC Flex & Chips Symposium, Feb. 2003, 32 pp.

* cited by examiner

SUBSTRATE CONNECTOR FOR INTEGRATED CIRCUIT DEVICES

BACKGROUND

1. Description of Related Art

Integrated circuits typically include various active and passive circuit elements which have been integrated into a piece of semiconductor material, often referred to as a die. The die may, in turn, be encapsulated into a package, which often includes a ceramic or plastic substrate although other materials may be used. These packages are usually attached to a printed circuit board, often by connecting pins arranged along the periphery of the package. In this manner, an electronic system can be assembled by connecting various integrated circuit packages to a printed circuit board.

In addition to mechanically connecting the integrated circuit package to the printed circuit board, the connecting pins also typically provide separate electrical connection terminals between the printed circuit board and the various inputs and outputs of the integrated circuit within the package. To increase the number of connection terminals, other package designs have been utilized. For example, in the pin grid array (PGA), ball grid array (BGA) and land grid array (LGA) packages, a large number of input/output (I/O) connection terminals are disposed in a two dimensional array over a substantial portion of a major surface of the package.

To increase space utilization, two or more integrated circuit dies may be attached to a printed circuit board in a stacked arrangement. The dies may be interconnected in a die-to-die stacked arrangement. Alternatively, each die may be placed in a package and the two packages may be stacked in a package-to-package arrangement. FIG. 1a shows an exploded view of one such known package-to-package stack indicated generally at 10. The stack 10 includes a first integrated circuit package 12, and a second integrated circuit package 14 which are physically and electrically connected together as shown in FIG. 1b using an interposer 16.

The integrated circuit package 12 includes a package substrate 20 on which an integrated circuit die 22 is mechanically and electrically connected by a plurality of solder bumps 24. Similarly, the integrated circuit package 14 includes a package substrate 26 to which an integrated circuit die 28 is mechanically and electrically connected by a plurality of solder bumps 30. Other electrical connectors including wires may be used in place of or in addition to the solder bumps 24, 30. The package substrates 20, 26 may have both internal and exterior conductors which are electrically connected to the solder bumps 24, 30 or to contact pads on the dies 22, 28.

The dies 22, 28 may be encapsulated in a polymer such as an epoxy layer 32 depicted for the die 28. The inputs and outputs of the stack 10 may be electrically connected to a printed circuit board using connection pins, solder bumps or other connection terminals.

As best seen in FIG. 1c, the interposer 16 includes a generally rectangular ring-shaped frame 34 which may be constructed of a dielectric material such as plastic or ceramic, for example. The frame 34 has a plurality of apertures distributed about its periphery into which plugs 36 may be punched into the frame apertures and secured therein in an interference fit. The plugs 36 are typically formed of an electrically conductive material such as copper and may each be bonded to aligned contact pads 40 and 42 of the package substrates 20 and 26, respectively, as shown in FIG. 1b. The copper plugs 36 may be bonded to the contact pads 40, 42 of the package substrates 20, 26 using stencil printed solder or other materials including electroplated solder, ink jet solder or adhesives or using other bonding techniques including thermocompression and thermosonic joining.

Each plug 36 can provide a separate electrical interconnection between the packages 12 and 14. The center to center spacing or "pitch" between adjacent force fit plugs 36 may be as low as 300 microns, in some applications. Interposers may be used to provide die-to-die or die-to-package substrate interconnections.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1A:
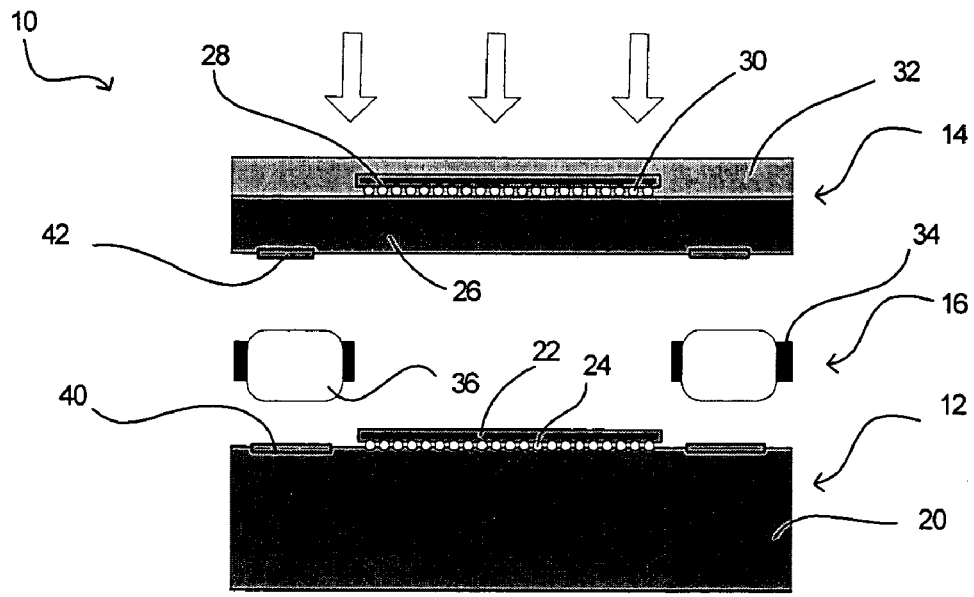
FIGS. 1a and 1b schematically illustrate a prior art interposer connecting integrated circuit packages in a package-to-package stack.
Figure 1B:
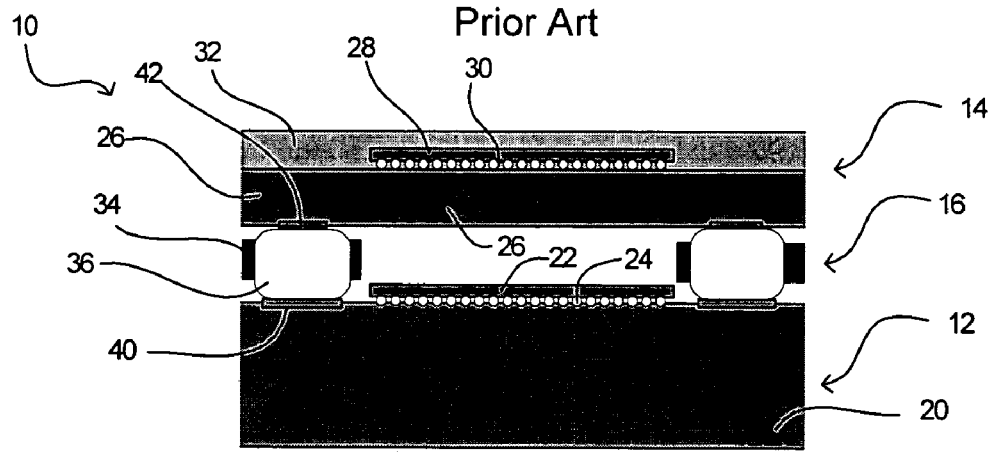
Figure 1C:
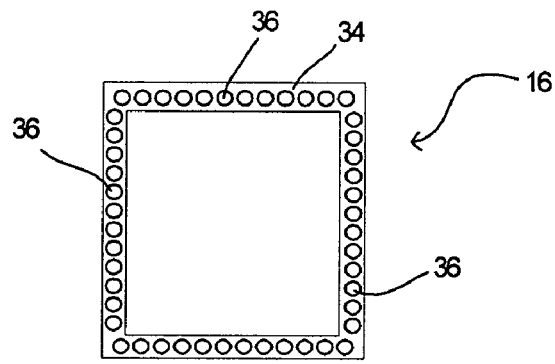
FIG. 1c is a top schematic view of the prior art interposer of FIGS. 1a and 1b.
Figure 2:
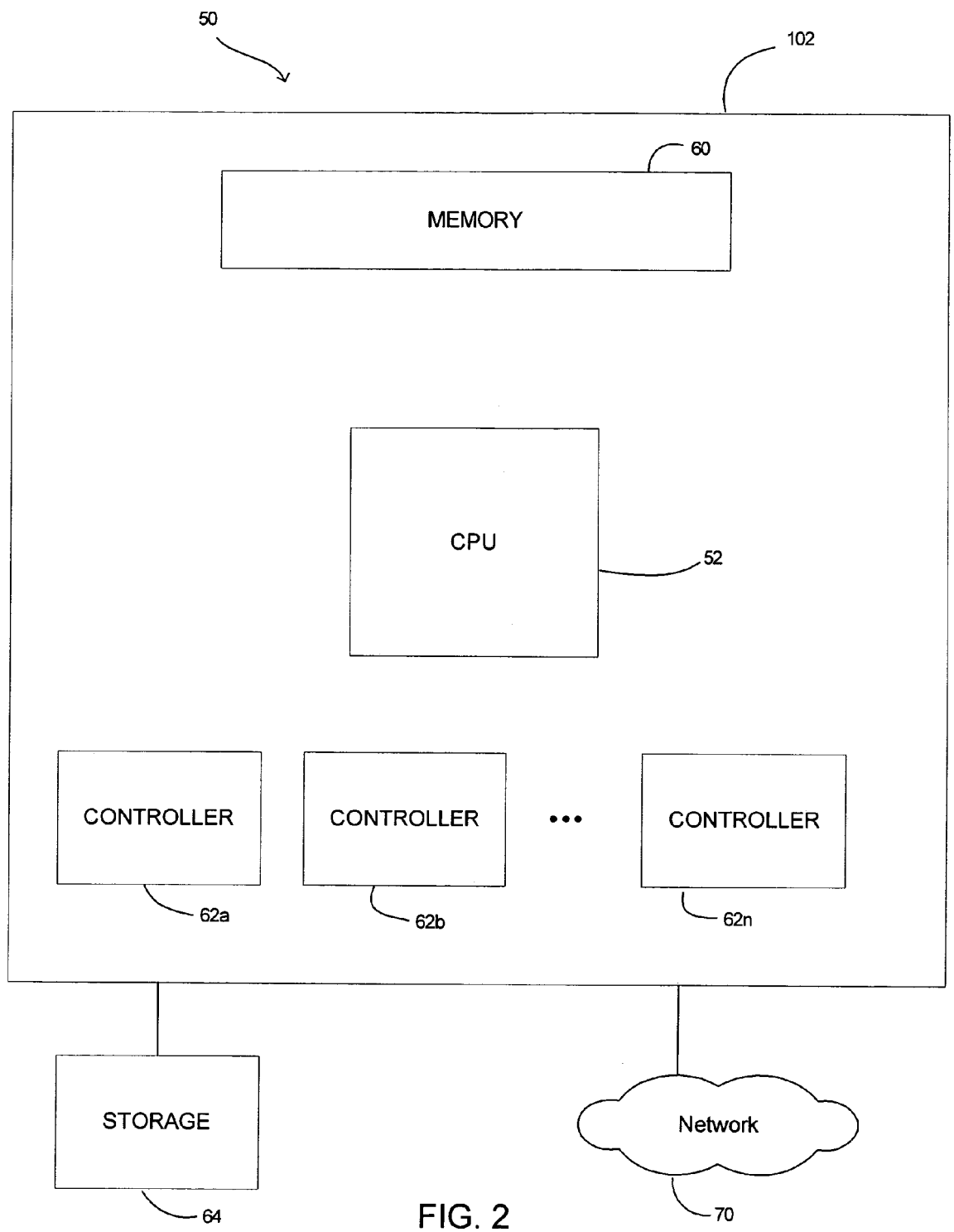
FIG. 2 illustrates one embodiment of a computing environment in which aspects of the description provided herein are embodied.

FIG. 2 illustrates a computing environment in which aspects of described embodiments may be embodied. A computer 50 includes one or more central processing units (CPU) 52 (only one is shown), a memory 60 and a plurality of controllers 62a, 62b . . . 62n. Each of the CPU 52, and controllers 62a, 62b . . . 62n include one or more electronic devices. Once such electronic device is represented by an electronic device 100 (FIG. 3) which is electrically and mechanically coupled to a printed circuit board 102.

Figure 3:
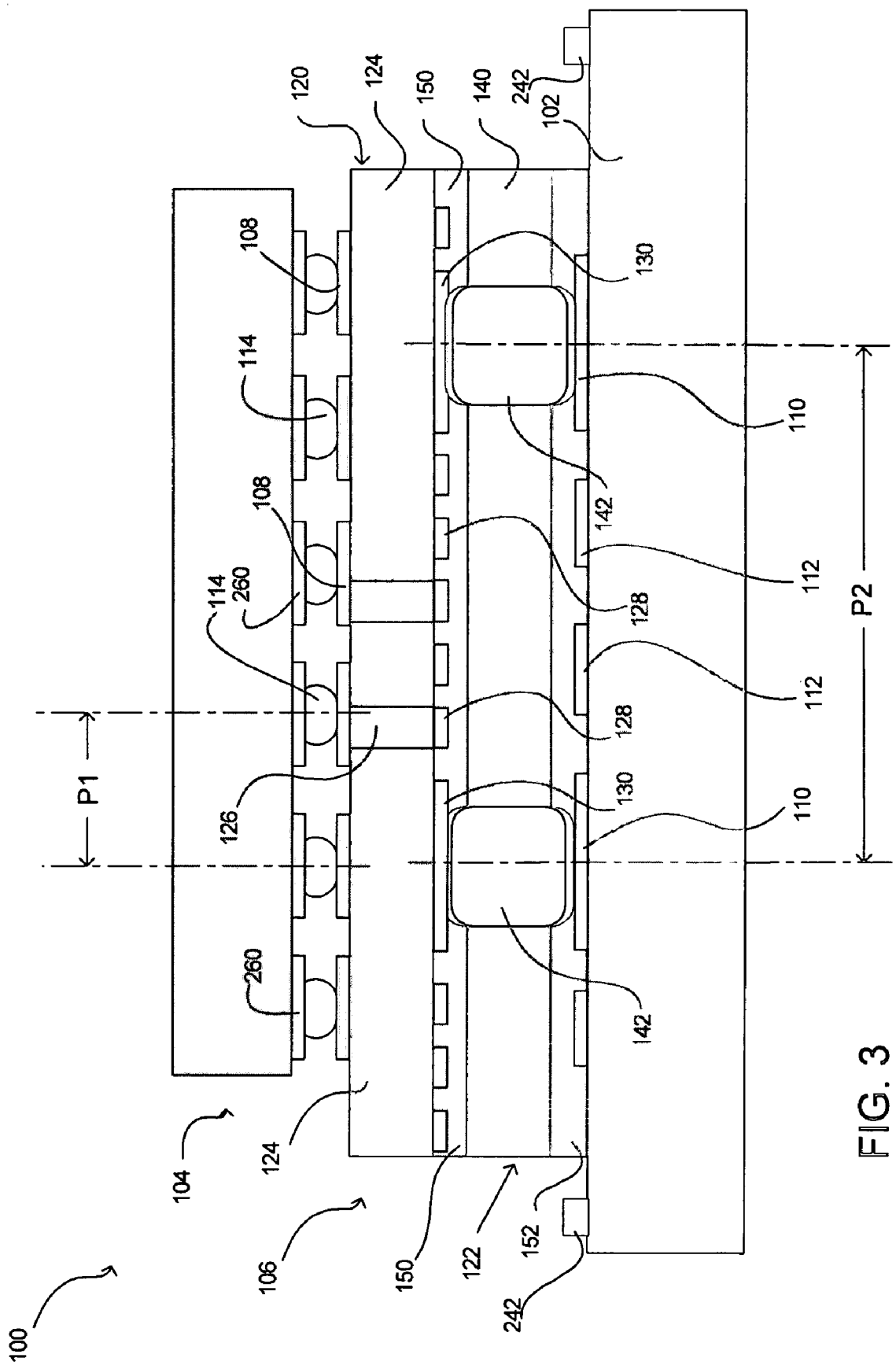
FIG. 3 schematically illustrates a package-to-connector stack utilizing a substrate connector in accordance with one embodiment of the present description.

The device 100 of this embodiment includes a package-to-connector stack comprising an integrated circuit package 104, which is mechanically and electrically connected to the circuit board 102 by a substrate connector 106. In the embodiment of FIG. 3, the substrate connector 106 has contacts 108 on a first side of the substrate connector 106, which are spaced at a first pitch P1. In addition, the substrate connector 106 has contacts 110 on a second side of the substrate connector 106, which are spaced, at a second pitch P2. In one application, as explained in greater detail below, this difference in pitch can permit the routing density of selected electrical connector lines, such as the lines 112, of the circuit board 102, to be reduced for some applications. It is appreciated that in other applications, other aspects of the description provided herein may be applied.

The printed circuit board 102 may be a single layer or multi-layered circuit board which has a plurality of conductive lines, including lines 112, that provide communication between the circuits in the device 100 and other components mounted to the board 102. Alternatively, one or more of the CPU 52, memory 60 and controllers 62a, 62b . . . 62n may be disposed on other cards such as daughter cards or expansion cards, some of which may use substrate connectors similar to the substrate connector 106.

An operating system and various applications execute on the CPU 52 and reside in the memory 60. The content residing in memory 60 may be cached in accordance with known caching techniques. Programs and data in memory 60 may be swapped into storage 64 as part of memory management operations. The computer 50 may comprise any computing device known in the art, such as a mainframe, server, personal computer, workstation, laptop, handheld computer, telephony device, network appliance, virtualization device, storage controller, network controller, etc. Any CPU 52 and operating system known in the art may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of known storage protocols. Data being written to or read from the storage 64 may be cached in accordance with known caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

In the illustrated embodiment, the package 104 has a plurality of solder bump contacts 114 arranged in an array on one face of the package 104. One such package is known as a "flip-chip." It is appreciated that other types of packages and contacts may be used.

Each solder bump contact 114 is bonded to a corresponding electrical contact 108 of the substrate connector 106, which in this embodiment, includes a patch substrate layer 120 disposed on an interposer layer 122. The patch substrate layer 120 includes a patch substrate 124 having a face on which the contacts 108 are disposed. The patch substrate layer 120 further includes a plurality of columnar electrical conductors 126 extending through the patch substrate 124 and electrically connected at one end to the contacts 108 on the face of the patch substrate 124. Disposed on an opposing face of the patch substrate 124 are a plurality of electrically conductive lines 128 and electrical contacts 130. The conductive lines 128 interconnect the columnar conductors 126 to the contacts 130 as appropriate for the particular application.

The interposer layer 122 includes a substrate 140 and a plurality of columnar electrical conductors 142 extending through the interposer substrate 140 and electrically connected at one end to the contacts 130 on the face of the patch substrate 124. The columnar connectors 142 of the interposer layer 122 may be electrically connected to the contacts 110 of the circuit board 102 as shown in FIG. 3.

In the embodiment of FIG. 3, the patch substrate 124 is physically bonded to the interposer substrate 140 by an adhesive layer 150. A second adhesive layer 152 may be applied to bond the interposer substrate 140 to a surface of the circuit board 102. In the illustrated embodiments, the contacts, lines, conductors, connectors, etc. have been depicted in a relatively small number for purposes of clarity. It is appreciated that the numbers of these elements may increase or decrease substantially, depending upon the particular application.

Figure 4:
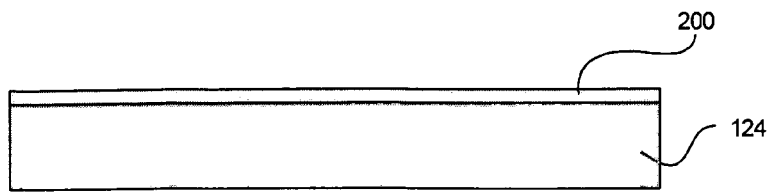
FIGS. 4-6 illustrate one example of operations to form a patch substrate layer of a substrate connector.
Figure 5:
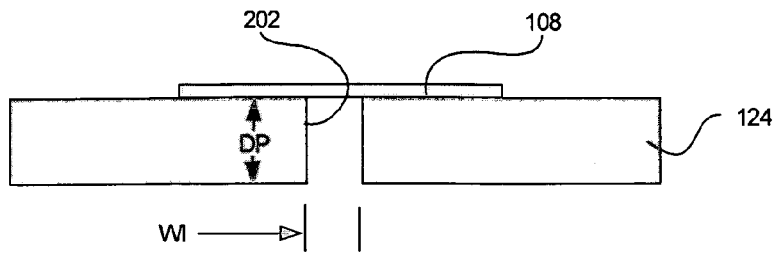
Figure 6:
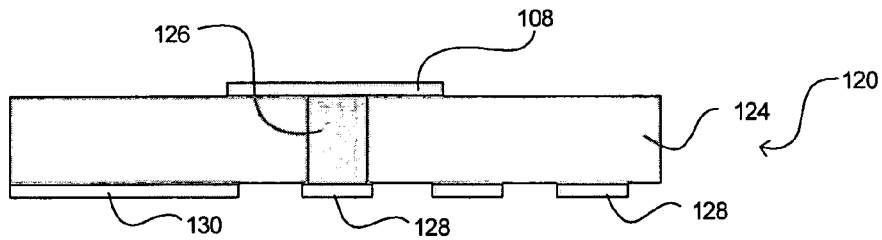

FIGS. 4-6 illustrate one example of operations to form a patch substrate layer 120 of a substrate connector 106. FIG. 4 shows a layer 200 of foil, such as a layer of conductive foil, formed or disposed over a surface of a core material or substrate, such as patch substrate 124. In one embodiment, layer 200 of foil may be formed by electroplating a surface of the substrate 124 with a conductive material, such as a metal, such as tin or copper, for example, to form a layer of conductive material. The layer 200 may also be formed by securing a sheet of conductive material such as a copper foil, to a surface of the substrate 124. The thickness of the layer 200 will depend upon the particular application. One example is a thickness in the range of 3 to 30 microns.

The patch substrate 124 may be formed of a variety of materials, depending upon the particular application. For example, patch substrate 124 may be a core or a layer of an epoxy resin, a bismaleimide triazine (BT), a polymer, or a polyimide. The patch substrate 124 may be a single layer substrate or may include multiple layers with one or more layers of conductor lines on or between adjacent layers of the patch substrate 124.

As shown in FIG. 5, the substrate 124 has a plurality of holes, vias or other apertures 202 distributed about its surface. FIG. 5 shows one example of such a hole 202 having depth DP and width WI formed through patch substrate 124. Each hole 202 may have a depth DP and width WI as appropriate for the particular application. For example, a suitable hole 202 may have a depth DP in a range of 25-200 microns and a width WI in a range of 50-100 microns. Other sizes may be utilized, depending upon the particular application.

For example, hole 202 may be formed by etching or by drilling with a mechanical drill or a laser such as a $CO_2$ laser, ultraviolet (UV) laser, etc. FIG. 6 shows the patch substrate hole 202 filled with an electrically conductive material in the hole to form a columnar conductor 126 extending through the patch substrate 124. The electrically conductive material may be copper, gold, silver or any other conductive material, depending upon the particular application. It is appreciated that the columnar conductor 126 may also be formed using a wire, plug, an electrical conduit, or other devices or means of conducting electric current and energy.

FIGS. 5 and 6 also show an external contact 108 formed in the shape of a pad on a surface of the patch substrate 124. The contact 108 may be formed, for example, by removing a portion of layer of foil 200. For example, the contacts 108 may be formed by an etch process, a patterned and etch process, a screen printed conductor process, patterning subtraction, etc. to remove a portion of layer of foil so as to provide portions, parts, or islands of layer of foil 200. Alternatively, the contacts 108 may be formed by deposition. The particular process selected to form the contacts 108 may depend upon the particular application.

The columnar conductor 126 is electrically coupled or connected to the contact 108. It is contemplated that the electrical connection may a direct contact, a direct attachment or may include conductive material disposed between the columnar conductor 126 and the contact 108, so long as a sufficient electrical connection or electrical energy conduit is formed between the contact 108 and the columnar conductor 126 to provide signaling, voltage, or power as appropriate.

The electrically conductive lines 128 and electrical contacts 130 may be formed on an opposing face of the patch substrate 124 in a manner similar to that of the contacts 108. As previously mentioned, the conductive lines 128 interconnect the columnar conductors 126 to the contacts 130 as appropriate for the particular application.

In a manner similar to that of the contact 108, the columnar conductor 126 is also electrically coupled or connected to a conductive line 128. It is contemplated that the electrical connection may a direct contact, a direct attachment or may include conductive material disposed between the columnar conductor 126 and the conductive line 128, so long as a sufficient electrical connection or electrical energy conduit is formed between the line 128 and the columnar conductor 126 to provide signaling, voltage, or power as appropriate.

Each columnar conductor 126 can provide a separate electrical interconnection between a contact 108 and a conductor line 128 of the patch substrate layer 120. The center to center spacing or "pitch" P1 between adjacent columnar conductors 126 may be in a range of 50-500 microns, in some applications, for example. It is appreciated that other spacings may be utilized, depending upon the particular application.

In the illustrated embodiment, the external contact 108 has a surface area, contact area, or cross-section that is larger than that of the columnar conductor 126 and the conductive lines 128. In this example, the external contact 108 is adapted to bond to a package connector such as a solder bump 114. It is appreciated that the relative sizes of the columnar conductor 126, contact 108 and conductive lines 128 may vary, depending upon the particular application.

Figure 7:
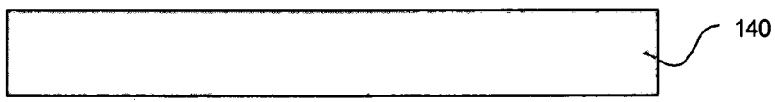
FIGS. 7-9 illustrate an example of operations to form an interposer layer of a substrate connector.
Figure 8:
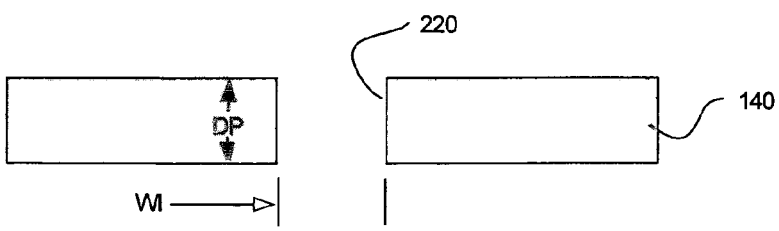
Figure 9:
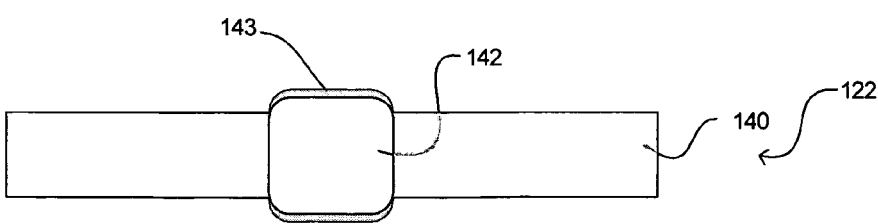

FIGS. 7-9 illustrate an example of operations to form an interposer layer 122 of a substrate connector 106. The interposer layer 122 includes an interposer substrate 140 which may be formed of a variety of materials, depending upon the particular application. For example, interposer substrate 140 may be a core or a layer of a dielectric such as ceramic, an epoxy resin, a bismaleimide triazine (BT), a polymer, or a polyimide or an organic material. The substrate 140 has a plurality of apertures 220 distributed about its surface. A plug or other columnar conductor 142 may be punched, implanted or otherwise inserted into or formed within the substrate apertures 220 and secured therein in an interference fit, for example.

The columnar conductors 142 are typically formed of an electrically conductive material such as copper and may each be physically bonded to aligned contacts 130, 110 of the patch substrate 124 and the circuit board 102, respectively, as shown in FIG. 3. The columnar conductors 142 are also electrically coupled or connected to the contacts 110, 130. It is contemplated that the electrical connection may a direct contact, a direct attachment or may include conductive material such as solder or tin plating 143 disposed between the columnar conductor 142 and the contact 130, 110, so long as a sufficient electrical connection or electrical energy conduit is formed between the contact 130, 110 and the columnar conductor 142 to provide signaling, voltage, or power as appropriate. Thus, for example, the columnar conductors 142 may be bonded to the contacts 110, 130 using stencil printed solder or other materials including electroplated solder, ink jet solder or adhesives or using other bonding techniques including metallurgical bonding, thermocompression and thermosonic joining. In one example, the thickness of the tin plating 143 of the columnar conductors 142 may be in a range of 1-20 microns.

Each columnar conductor 142 can provide a separate electrical interconnection between the patch substrate layer 120 and the circuit board 102. The center to center spacing or "pitch" P2 between adjacent force fit columnar conductors 142 may be in a range of 500-1270 microns, in some applications, for example.

Each hole 220 may have a depth DP and width WI as appropriate for the particular application. For example, a suitable hole 220 may have a width WI in a range of 25-200 microns and a depth DP in a range of 50-100 microns. Other sizes may be utilized, depending upon the particular application.

In the illustrated embodiment, the external contact 130 has a surface area, contact area, or cross-section that is larger than that of the columnar conductor 142 and the conductive lines 128. In this example, the external contact 130 is adapted to bond to a connector such as an interposer columnar conductor 142. It is appreciated that the relative sizes of the columnar conductor 142, contact 130 and conductive lines 128 may vary, depending upon the particular application.

The holes 220 may be formed by etching or by drilling with a mechanical drill or a laser such as a CO2 laser, ultraviolet (UV) laser, etc. Alternative to a plug, the hole 220 may be filled with an electrically conductive material in the hole to form a columnar conductor 142 extending through the interposer substrate 140. The electrically conductive material may be copper, gold, silver or any other conductive material, depending upon the particular application. It is appreciated that the columnar conductor 142 may also be formed using a wire, an electrical conduit, or other devices or means of conducting electric current and energy.

A patch substrate 124 may be diced into a number of patch substrate portions, each portion having a selected number of structures such as the columnar connectors 126, contacts 108, 130 and conductor line 128 of FIG. 6. For instance, patch substrate 124 may be a type of wafer or substrate on which devices are typically formed in an integrated circuit (IC) or silicon device processing chamber. After structures, such as those shown in FIG. 6, are formed on such a wafer or substrate, the wafer of substrate may be subsequently diced into portions appropriate for interfacing between electronic devices such as electronic device package 104 or the interposer substrate 140 as described above with respect to FIG. 3.

In a similar manner, an interposer substrate 140 may be diced into a number of interposer substrate portions, each portion having a selected or desired number of structures such as columnar connectors 142 shown in FIG. 9. After structures, such as those shown in FIG. 9, are formed on or in such a wafer or substrate, the wafer or substrate may be subsequently diced into portions appropriate for interfacing between electronic devices such as a patch substrate 124 or a circuit board 102 as described above with respect to FIG. 3.

Figure 10:
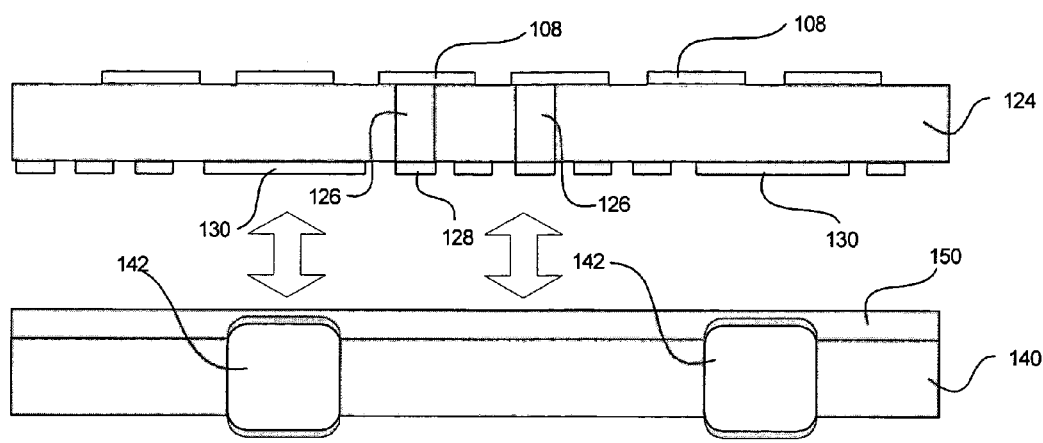
FIGS. 10-11 illustrate one example of operations to assemble a patch substrate layer and an interposer layer into a substrate connector.
Figure 11:
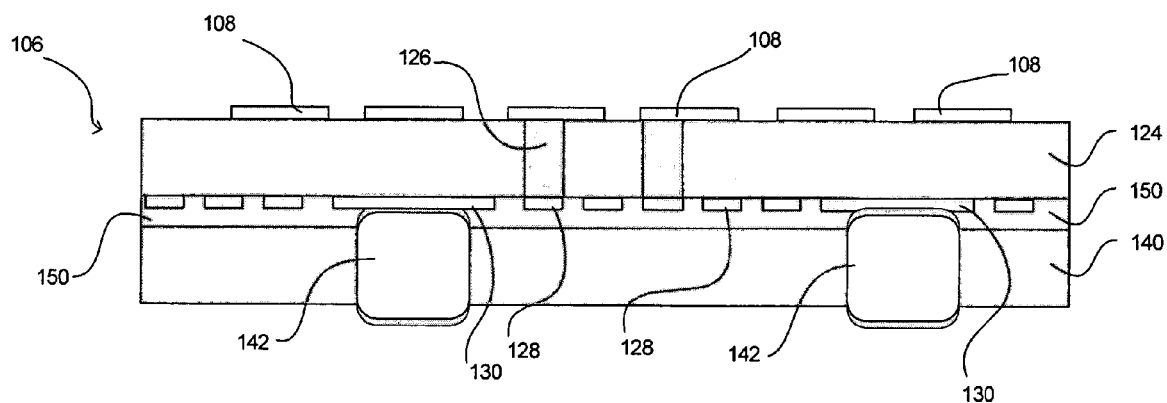

As shown in FIG. 10, the patch substrate 124 may be physically bonded to the interposer substrate 140 to form a substrate connector 106 (FIG. 11). In one embodiment, an adhesive layer 150 may be utilized to secure the patch substrate 124 and interposer substrate 140 together. The adhesive layer 150 may be a B-stage epoxy and may have a thickness of 5-50 microns, for example. It is appreciated that other thicknesses and bonding techniques may be used, depending upon the particular application. As previously mentioned, the columnar conductors 142 of the interposer substrate 140 may be bonded to the contacts 130 of the patch substrate 124 using stencil printed solder or other materials including electroplated solder, ink jet solder or adhesives or using other bonding techniques including metallurgical, thermocompression and thermosonic joining.

Figure 12:
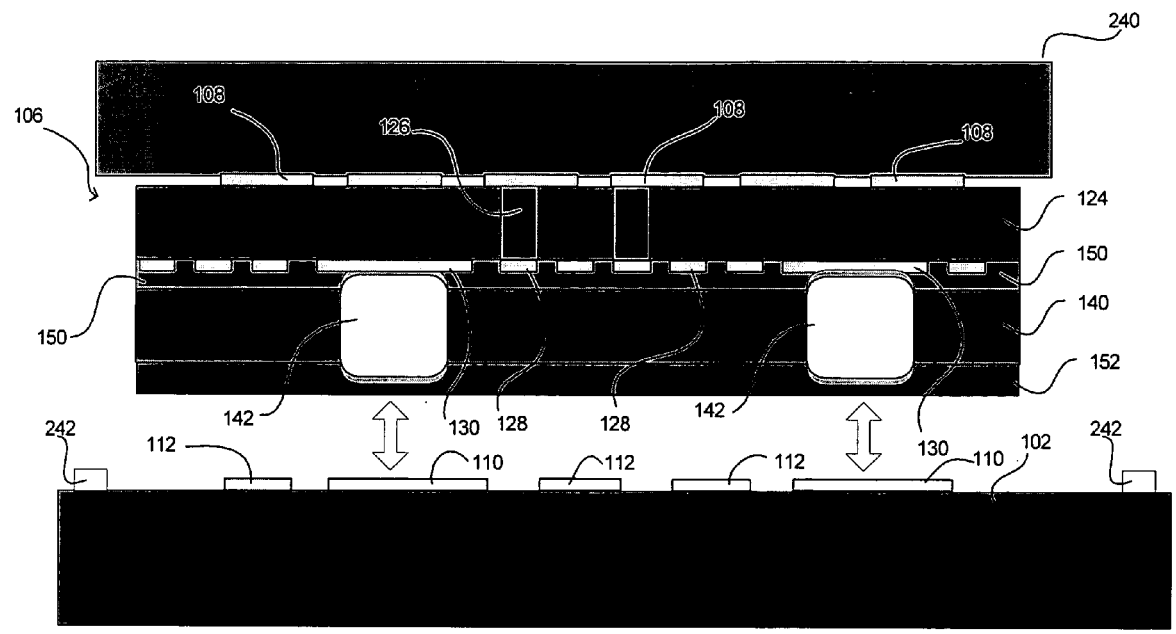
FIGS. 12-15 illustrate one example of operations to connect an integrated circuit package to a printed circuit using a substrate connector.

FIG. 12 is a cross-sectional view of a substrate connector 106 attached to a packaging placer 240 for placing a substrate connector 106 on a first electrical device such as the circuit board 102. FIG. 12 shows substrate connector 106 having wet or uncured electrically insulating adhesive layer 152 laminated, pasted over, formed over, coated on or otherwise disposed on a surface of the interposer substrate 140 facing the circuit board 102. Adhesive layer 152 may be formed of any adhesive as described above with respect to adhesive 150 of FIG. 11. A wet or uncured adhesive such as B-stage epoxy may be cured as appropriate to complete the bond. It is also contemplated that an adhesive may be formed on a surface of the printed circuit board 102 or other electronic device (e.g., such as by spreading the uncured adhesive on a surface), with or without forming a layer 152 of adhesive on a surface of the substrate connector 106.

Figure 13:
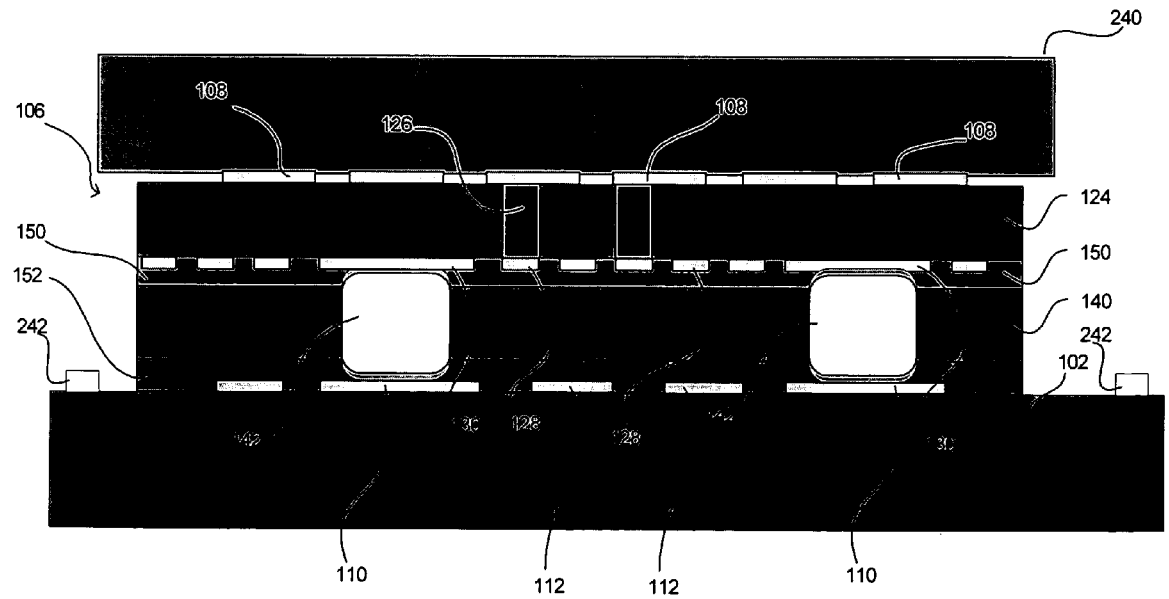

FIGS. 12 and 13 also show fiducials 242 on an electronic device such as a printed circuit board 102, to facilitate attaching the patch connector 106 to the printed circuit board 102 in an aligned position. In one instance, packaging placer 240 may be a placer that uses vacuum detachable couplings to couple to the fiducials 242 such that contacts of the substrate connector 106, such as columnar conductors 142 of the interposer layer 122, are aligned to contact contacts of an electrical device such as the contacts 110 of the printed circuit board 102. In one embodiment, alignments may be achieved to within a +/−25 micron tolerance, for example. It is appreciated that the alignment tolerances may vary, depending upon the particular application. It is further appreciated that a variety of techniques may be used to place the substrate connector 106 on a first electrical device such as a circuit board 102, including hand placement by a human assembler.

Various bonding techniques including metallurgical bonding techniques such as thermo compression and vacuum bonding may be used to assure proper connection of the columnar conductors 142 of the substrate connector 106 to the contacts 110 of an electrical device such as the circuit board 102. Appropriate bonding techniques may be used to bond the adhesive layer 152 to facing surfaces of the substrate connector 106 and the circuit board 102. It is appreciated that the bonding techniques selected may depend upon the particular application.

Figure 14:
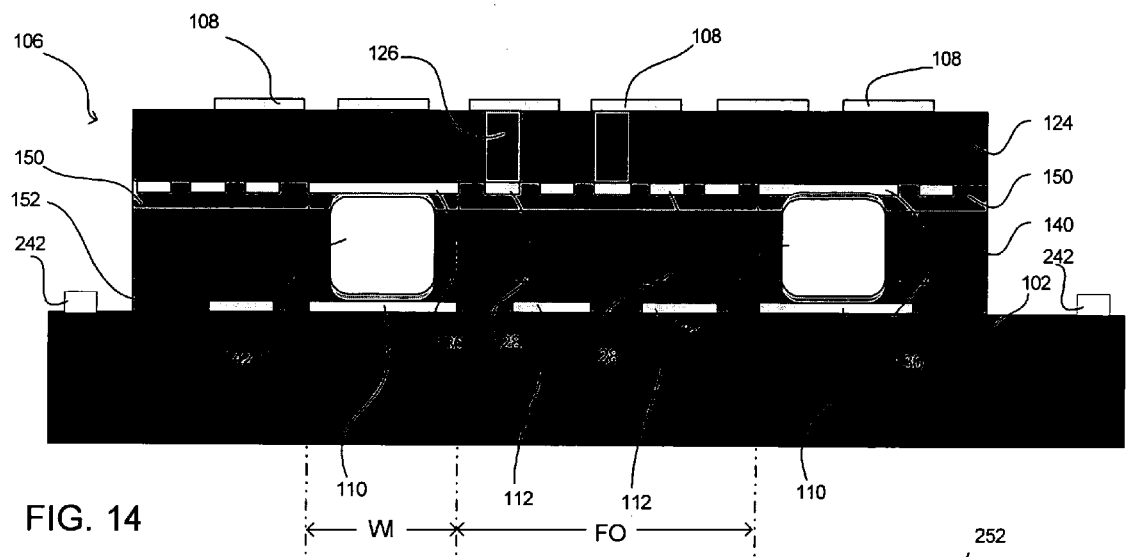

FIG. 14 is a cross-sectional view of a substrate connector 106 attached to an electrical device such as the circuit board 102. Contacts such as the plated columnar conductors 142 are electrically and physically coupled to contacts such as the contacts 110 of the printed circuit board 102. External connection contacts such as contacts 108 are presented for coupling to a second electronic device.

Figure 15:
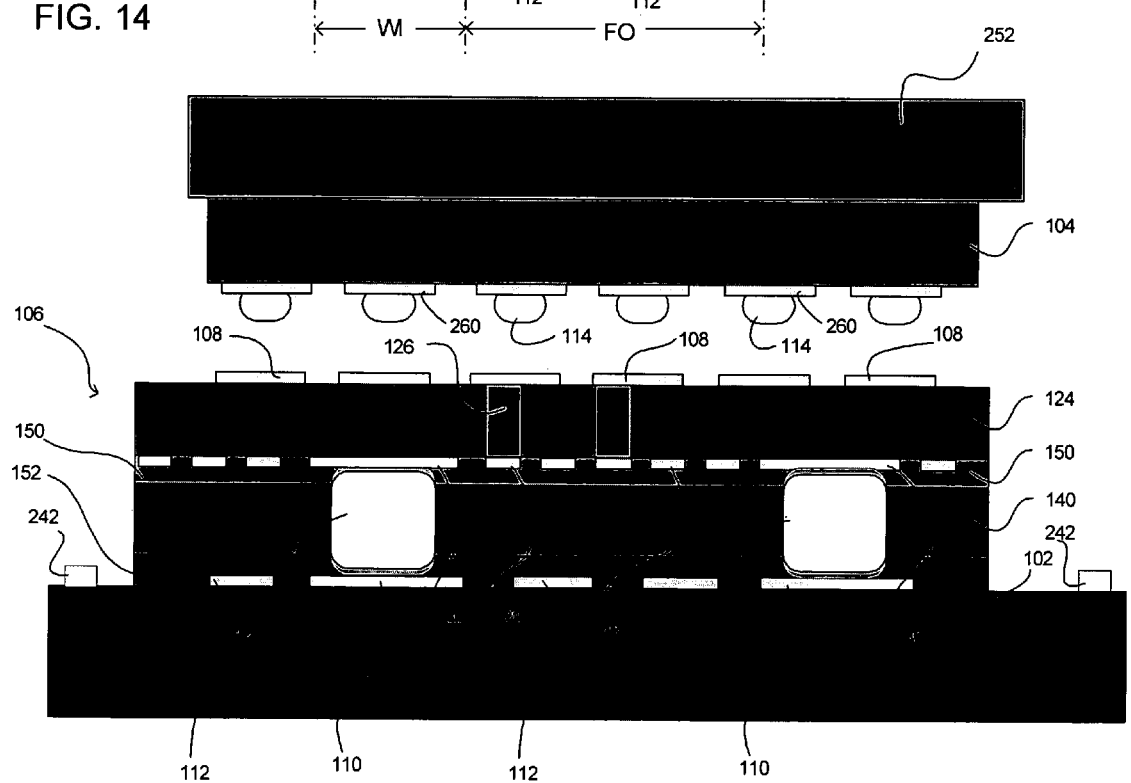

In a manner similar to the placement of the substrate connector 106, a second electronic device such as integrated circuit package 104 may be aligned for placement on the substrate connector 106. In one example as depicted in FIG. 15, a packaging placer 252 similar to the placer 240 may utilize vacuum detachable coupling to couple to integrated circuit package 104 and fiducials 242 such that contacts of the integrated circuit package such as contacts 114, are aligned to contact contacts of the substrate connector 106 such as contacts 108 to within a +/−25 micron tolerance, for example. It is appreciated that the alignment tolerances may vary, depending upon the particular application. It is further appreciated that a variety of techniques may be used to place an electronic device on the substrate connector 106, including hand placement by a human assembler.

FIG. 3 is a cross-sectional view of the integrated circuit package 104 physically attached to and electronically coupled to the substrate connector 106. In this embodiment, the integrated circuit package 104 and substrate connector 106 are coupled by a plurality of solder balls or bumps 114 which may be formed on external connection contacts 260 of the package 104. Alternatively, it is also appreciated that the solder balls 114 or other connectors or contacts may be formed on contacts 108 of the substrate connector 106. Once aligned, a reflow process, such as a thermo-process, may be used to reflow interconnect each solder ball 114 to a contact such as the contacts 108 of the substrate connector 106 or the contacts 260 of the package 104.

In one embodiment, the external connection contacts 108 of the substrate connector may form a land grid array of contacts. Also, each contact 108 may have a diameter in a range of between 50 and 100 microns, for example. Similarly, the plated contacts of the columnar conductors 142 of the substrate connector 106 may form a land grid array of contacts. It is appreciated that the contacts of the substrate connector 106 may be laid out in a variety of patterns and distributions, depending upon the particular application.

As previously mentioned, in the embodiment of FIG. 3, the contacts 108 on a first side of the substrate connector 106, are spaced at a first pitch P1. For example, the contacts 108 may be spaced at a pitch of 250 microns, a spacing suitable for a variety of flip chips and other integrated circuits. In addition, the columnar conductors 142 on a second side of the substrate connector 106, are spaced, at a second pitch P2, wider than the pitch P1. For example, the columnar conductors 142 may be spaced at a pitch of 0.5 mm.

By comparison, ball-shaped contacts of a ball gate array are often spaced at a still larger pitch such as 1.27 mm, for example. Thus, in one aspect, columnar conductors 142 on one side of a substrate connector 106 may be spaced at a pitch P2 intermediate that of the pitch P1 of contacts 108 on another side of a substrate connector 106 and a pitch of contacts of a ball gate array, for example. In one application, this intermediate pitch can permit the routing density of selected electrical connector lines, such as the lines 112, of the circuit board 102, to be increased as compared to those often associated with ball gate array contacts, yet decreased as compared to those often associated with bump connectors of flip chip and other integrated circuits.

For example, in the embodiment of FIG. 14, the substrate connector contacts 130 at one end of the columnar conductors 142 may have a width WI of 0.125 mm. At a pitch P2 of 0.5 mm between adjacent columnar conductors 142, a fan out area FO between adjacent contacts 130 is defined at a width 0.375 mm, for example. Within this fan out area, conductors lines 128 may be laid out at a relatively high density in accordance with the relatively high density of contacts 108 coupling to the integrated circuit 104.

In this example, the circuit board contacts 110 at the other end of the columnar conductors 142 may again have a width WI of 0.125 mm. Such a width may, in some applications, be substantially smaller than corresponding circuit board contact pads for ball-shaped solder ball conductors of a ball gate array.

At a pitch P2 of 0.5 mm between adjacent columnar conductors 142, a fan out area FO between adjacent contacts 110 may again be defined at a width 0.375 mm, for example. Within this fan out area, conductors lines 112 of the circuit board 102 which may be larger than the conductor lines 128 of the substrate connector 106, may be laid out at a lower density as compared to the density of the conductor lines 128 of the substrate connector 106. By comparison, conductors lines 112 of the circuit board 102 may be laid out at a somewhat higher density as compared to the density of the conductor lines of a printed circuit board intended for use with a connector having a wider pitch such as a ball gate array connector, for example.

It is appreciated that the higher density of conductor lines 128 of the substrate connector 106 may, in some applications, result in a somewhat lower yield for substrate connectors 106 as compared to the corresponding area of a printed circuit board containing the conductor lines 112. However, because a substrate connector 106 may, in some applications, be a smaller component than a printed circuit board, a smaller yield may nonetheless be acceptable.

It is appreciated that in other applications, other aspects of the description provided herein may be applied. Furthermore, the dimensions set forth above are provided for purposes of illustration. It is appreciated that other dimensions may be utilized as well. For example, contacts 108 and 130 may have a width in a range of 0.025-0.25 mm and the columnar conductors 142 may have a width in a range of 0.10-0.25 mm and be positioned at a pitch of in a range of 0.50-1.27 in some applications, for example.

In the embodiment of FIGS. 12-15, a substrate connector 106 is bonded to a printed circuit board 102 before an integrated circuit package 104 is bonded to the substrate connector 106. It is appreciated that the order in which devices are bonded together may vary, depending upon the particular application. For example, the solder bumps 114 of an integrated circuit package 104 may be bonded to the external contacts 108 on one side of a substrate connector 106 in a manner similar to that depicted in FIG. 14. The columnar conductors 142 of the substrate connector 106 may then be aligned for bonding to another electronic device.

Figure 16:
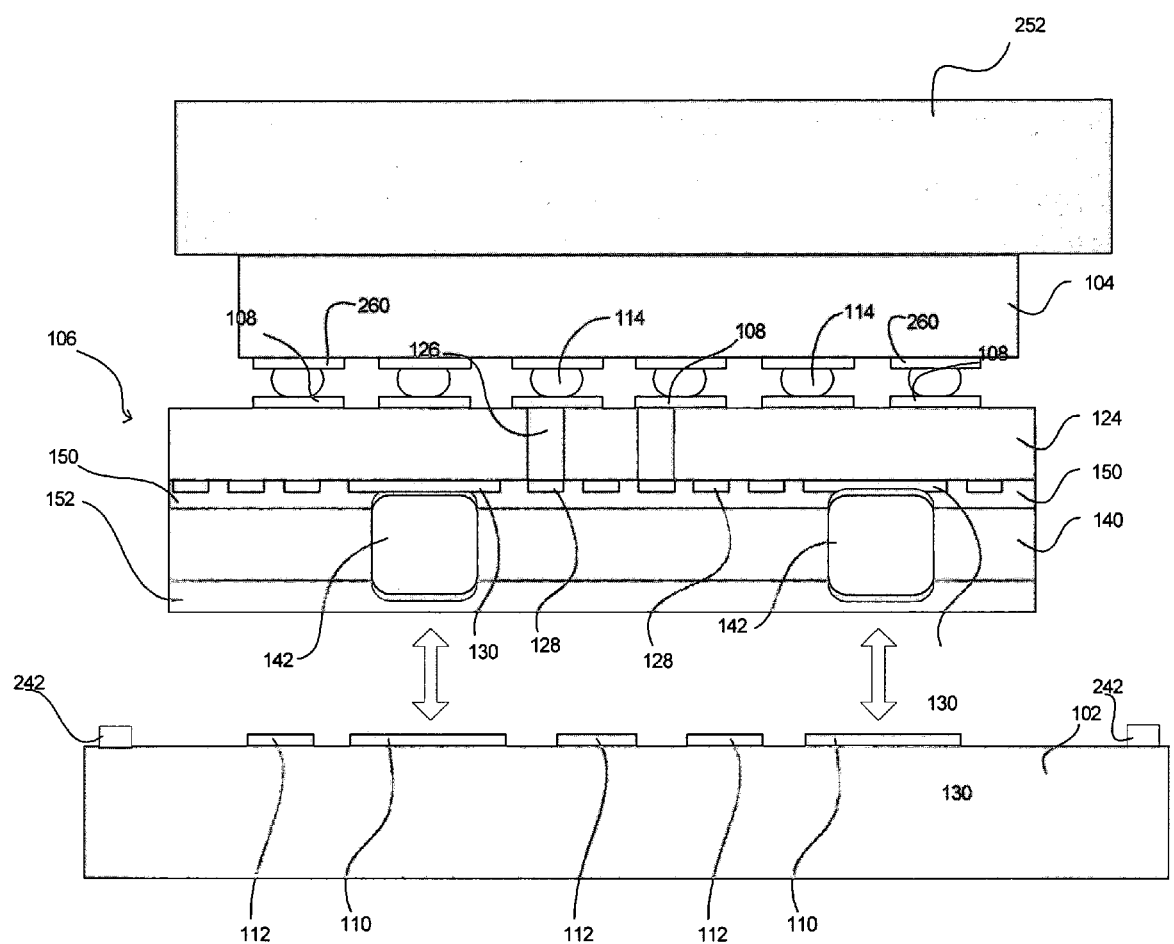
FIG. 16 illustrates another example of operations to connect an integrated circuit package to a printed circuit using a substrate connector.

In one example as depicted in FIG. 16, a packaging placer 252 may utilize vacuum detachable coupling to couple to integrated circuit package 104 and fiducials 242 of the printed circuit board 102 such that contacts such as the plated contacts of the columnar conductors 142 of the substrate connector 106, are aligned to contact contacts 110 of the circuit board 102, to within a +/−25 micron tolerance, for example. It is appreciated that the alignment tolerances may vary, depending upon the particular application. It is further appreciated that a variety of techniques may be used to place an electronic device on the circuit board 102, including hand placement by a human assembler.

Additional Embodiment Details

In certain embodiments, the substrate connector embodiments may be embodied in a computer system including a video controller to render information to display on a monitor coupled to a computer system comprising a desktop, workstation, server, mainframe, laptop, handheld computer, etc. Alternatively, the substrate connector embodiments may be embodied in a computing device that does not include a video controller, such as a switch, router, etc.

The illustrated operations of FIGS. 3-16 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 17:
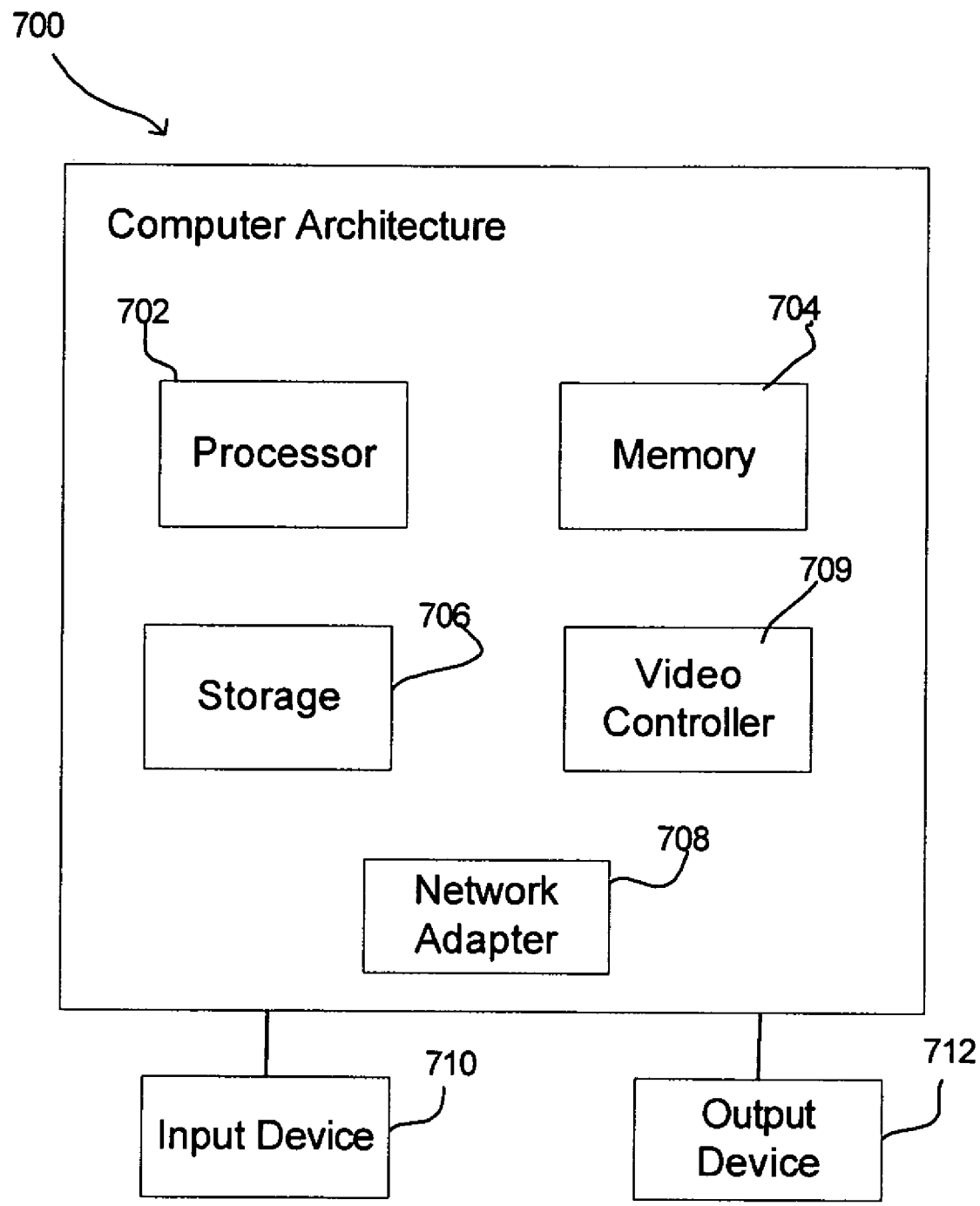
FIG. 17 illustrates an architecture that may be used with the described embodiments.

FIG. 17 illustrates one embodiment of a computer architecture 700 which can utilize components, such the devices shown in FIG. 3. One or more components or devices may utilize a substrate connector in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a substrate connector in accordance with the description provided herein. Thus, substrate connector embodiments may be embodied in computer systems or other systems in which a substrate connector in accordance with the present description is mounted on one or both of a motherboard and an expansion card. Accordingly, in some system embodiments, the system may lack an expansion card, and a substrate connector in accordance with the present description may be mounted on a motherboard. In another system embodiment, a substrate connector in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

The foregoing description of various embodiments has been presented for the purposes of illustration and explanation. It is not intended to be exhaustive or to limit to the precise form disclosed. Many modifications and variations are possible in light of the above teaching. For example, a substrate connector in accordance with the present disclosure may be used to connect a die to a circuit board.

What is claimed is:

1. An apparatus for use with a printed circuit board (PCB) having a plurality of electrical contacts disposed on said PCB, comprising:

an interposer which includes a substrate having a first side adapted to be bonded to said PCB, a second side disposed opposite the first side, and a first plurality of columnar conductors extending through said interposer substrate, each of said columnar conductors being adapted to be electrically connected to a PCB contact; and a patch substrate having a first side bonded to said second side of said interposer substrate, a first plurality of contacts disposed on said first side of said patch substrate, each contact being physically and electrically bonded to a columnar conductor of said interposer substrate, a second side disposed opposite the first side of said patch substrate, a second plurality of contacts disposed on said second side of said patch substrate, a second plurality of columnar conductors extending through said patch substrate from said first side to said second side of said patch substrate and spaced from said first plurality of contacts on said first side of said patch substrate, and a plurality of conductor lines disposed on said first side of said patch substrate and electrically connecting columnar conductors of said second plurality of columnar conductors to contacts of said first plurality of contacts on said first side of said patch substrate; each of said second plurality of columnar conductors being electrically connected to a contact of said second plurality of contacts of said patch substrate.

2. The apparatus of claim 1 further for use with an electronic device which includes an integrated circuit, said device having a plurality of electrical contacts, wherein each patch substrate contact of said second plurality of contacts is adapted to be physically and electrically bonded to a contact of said electronic device.

3. The apparatus of claim 1 further comprising a first electrically insulative adhesive layer adapted to physically bond said interposer substrate to said PCB.

4. The apparatus of claim 1 further comprising a second electrically insulative adhesive layer physically bonding said interposer substrate to said patch substrate.

5. The apparatus of claim 2 wherein said electrical contacts of said electronic device comprise solder bumps substantially evenly spaced at a first pitch and wherein said first columnar conductors of said interposer are substantially evenly spaced at a second pitch wider than said first pitch.

6. The apparatus of claim 2 wherein said first plurality of columnar conductors of said interposer substrate comprises a plurality of conductive plugs force fit into said interposer substrate and said second plurality of columnar conductors of said patch substrate comprises a plurality of vias formed within said patch substrate and conductive material filled into each via.

7. The apparatus of claim 1 wherein said PCB contacts are each physically and electrically bonded to a columnar conductor of said interposer substrate, said PCB further has a plurality of conductor lines disposed on said PCB between said contacts disposed on said PCB and wherein the density of said plurality of conductor lines disposed on said first side of said patch substrate is greater than the density of said plurality of conductor lines disposed on said PCB between said contacts disposed on said PCB.

8. The apparatus of claim 1 wherein each columnar conductor of said interposer substrate is bonded to a patch substrate contact by one of thermo-compression bonding and vacuumed hot press.

9. The apparatus of claim 1, wherein the patch substrate comprises a layer of one of an epoxy, a bismaleimide triazine (BT), a polymer, and a polyimide.

10. The apparatus of claim 1, wherein the contacts of said PCB are spaced and distributed in a land grid array (LGA) and the columnar conductors of said interposer are spaced and distributed in a land grid array sufficient to electrically and physically bond to said land grid array of said PCB.

11. The apparatus of claim 2, wherein the contacts of said electronic device are spaced and distributed in a land grid array (LGA) and the contacts disposed on said second side of said patch substrate are spaced and distributed in a land grid array and adapted to electronically connect to said land grid array of said electronic device.

12. A system comprising:

a printed circuit board having a plurality of electrical contacts disposed on said circuit board and a plurality of electronic devices electrically coupled to said circuit board contacts;

a video controller electrically coupled to said devices;

an interposer which includes a substrate having a first side bonded to said circuit board, a second side disposed opposite the first side, and a first plurality of columnar conductors extending through said interposer substrate, each of said columnar conductors being electrically connected to a circuit board contact; and a patch substrate having a first side bonded to said second side of said interposer substrate, a first plurality of contacts disposed on said first side of said patch substrate, each contact being physically and electrically bonded to a columnar conductor of said interposer substrate, a second side disposed opposite the first side of said patch substrate, a second plurality of contacts disposed on said second side of said patch substrate, a second plurality of columnar conductors extending through said patch substrate from said first side to said second side of said patch substrate and spaced from said first plurality of contacts on said first side of said patch substrate, and a plurality of conductor lines disposed on said first side of said patch substrate and electrically connecting columnar conductors of said second plurality of columnar conductors to contacts of said first plurality of contacts on said first side of said patch substrate; each of said second plurality of columnar conductors being electrically connected to a contact of said second plurality of contacts of said patch substrate.

13. The system of claim 12 further comprising an electronic device which includes an integrated circuit, said device having a plurality of electrical contacts, each device electrical contact being physically and electrically bonded to a patch substrate contact of said second plurality of contacts.

14. The system of claim 12 further comprising a first electrically insulative adhesive layer physically bonding said interposer substrate to said circuit board.

15. The system of claim 12 further comprising a second electrically insulative adhesive layer physically bonding said interposer substrate to said patch substrate.

16. The system of claim 13 wherein said electrical contacts of said electronic device comprise solder bumps substantially evenly spaced at a first pitch and wherein said first columnar conductors of said interposer are substantially evenly spaced at a second pitch wider than said first pitch.

17. The system of claim 13 wherein said first plurality of columnar conductors of said interposer substrate is a plurality of conductive plugs force fit into said interposer substrate and said second plurality of columnar conductors of said patch substrate is a plurality of vias formed within said patch substrate and filled with conductive material.

18. The system of claim 12 wherein said printed circuit board contacts are each physically and electrically bonded to a columnar conductor of said interposer substrate, said printed circuit board further has a plurality of conductor lines disposed on said printed circuit board between said contacts disposed on said printed circuit board and wherein the density of said plurality of conductor lines disposed on said first side of said patch substrate is greater than the density of said plurality of conductor lines disposed on said printed circuit board between said contacts disposed on said printed circuit board.

19. The system of claim 12 wherein each columnar conductor of said interposer substrate is bonded to a patch substrate contact by one of thermo-compression bonding and vacuumed hot press.

20. The system of claim 12, wherein the patch substrate comprises a layer of one of an epoxy, a bismaleimide triazine (BT), a polymer, and a polyimide.

21. The system of claim 12, wherein the contacts of said circuit board are spaced and distributed in a land grid array (LGA) and the columnar conductors of said interposer are spaced and distributed in a land grid array sufficient to electrically and physically bond to said land grid array of said circuit board.

22. The system of claim 13, wherein the contacts of said electronic device are spaced and distributed in a land grid array (LGA) and the contacts dispose on said second side of said patch substrate are spaced and distributed in a land grid array sufficient to electronically connect to said land grid array of said electronic device.

* * * * *